(12) United States Patent
Zaslavsky

(10) Patent No.: US 8,742,863 B1
(45) Date of Patent: *Jun. 3, 2014

(54) TEMPERATURE-CORRECTED FREQUENCY CONTROL WITH CRYSTAL OSCILLATORS FOR INITIAL FREQUENCY ACQUISITION

(75) Inventor: Alex Zaslavsky, Petach-Tikva (IL)

(73) Assignee: Marvell International Ltd., Hamilton (BM)

( * ) Notice: Subject to any disclaimer, the term of this patent is extended or adjusted under 35 U.S.C. 154(b) by 160 days.

This patent is subject to a terminal disclaimer.

(21) Appl. No.: 13/189,595

(22) Filed: Jul. 25, 2011

Related U.S. Application Data

(63) Continuation of application No. 12/394,056, filed on Feb. 27, 2009, now Pat. No. 8,031,024.

(60) Provisional application No. 61/032,268, filed on Feb. 28, 2008.

(51) Int. Cl.
  *H03L 1/02* (2006.01)
  *H03B 5/32* (2006.01)
  *H04B 1/40* (2006.01)

(52) U.S. Cl.
  USPC ............... 331/176; 331/44; 331/158; 455/76

(58) Field of Classification Search
  USPC ............. 331/44, 66, 154, 158, 160, 162, 176; 455/76
  See application file for complete search history.

(56) References Cited

U.S. PATENT DOCUMENTS

| | | | |
|---|---|---|---|
| 4,453,834 A * | 6/1984 | Suzuki et al. | 368/201 |
| 5,659,884 A | 8/1997 | Daughtry, Jr. et al. | |
| 5,757,244 A | 5/1998 | Nonaka et al. | |
| 5,883,550 A * | 3/1999 | Watanabe et al. | 331/176 |
| 5,953,648 A | 9/1999 | Hutchison et al. | |
| 6,522,212 B1 * | 2/2003 | Kodim | 331/176 |
| 6,636,121 B2 | 10/2003 | Barak et al. | |
| 6,985,705 B2 | 1/2006 | Shohara | |
| 7,221,921 B2 | 5/2007 | Maligeorgos et al. | |
| 7,403,078 B2 * | 7/2008 | Routama et al. | 331/176 |

(Continued)

FOREIGN PATENT DOCUMENTS

| | | |
|---|---|---|
| GB | 2368235 A | 4/2002 |
| WO | 0133870 A2 | 5/2001 |
| WO | 0247281 A1 | 6/2002 |
| WO | 2005099107 A1 | 10/2005 |

OTHER PUBLICATIONS

U.S. Appl. No. 61/454,435, filed Mar. 18, 2011.
U.S. Appl. No. 61/467,329, filed Mar. 24, 2011.

(Continued)

*Primary Examiner* — Levi Gannon

(57) ABSTRACT

A communication terminal includes a crystal oscillator, a transceiver and circuitry. The crystal oscillator belongs to a specified type in which a dependence of an output frequency on temperature has one or more temperature dependence coefficients. The transceiver is arranged to operate an AFC loop having an initial frequency accuracy requirement that is more stringent than an uncompensated frequency accuracy of the crystal oscillator. The circuitry is arranged to determine output frequencies of the crystal oscillator at respective operating temperatures, to compute the temperature dependence coefficients based on the output frequencies and operating temperatures, to correct a frequency error in the output frequency using the dependence and the temperature dependence coefficients, to ascertain that the corrected frequency error meets the initial frequency accuracy requirement, and to subsequently correct a frequency of the received signal using the AFC loop.

16 Claims, 4 Drawing Sheets

(56) References Cited

U.S. PATENT DOCUMENTS

| | | | |
|---|---|---|---|
| 7,466,209 B2 * | 12/2008 | Babitch | 331/66 |
| 7,548,130 B2 * | 6/2009 | Kobayashi | 331/176 |
| 7,728,684 B2 * | 6/2010 | Tozer | 331/176 |
| 8,031,024 B1 | 10/2011 | Zaslavsky | |
| 2002/0158693 A1 * | 10/2002 | Soong et al. | 331/18 |
| 2003/0144020 A1 | 7/2003 | Challa et al. | |
| 2005/0093638 A1 | 5/2005 | Lin et al. | |
| 2007/0178875 A1 | 8/2007 | Rao et al. | |
| 2009/0195322 A1 | 8/2009 | Yan et al. | |
| 2010/0331019 A1 | 12/2010 | Bhattacharjee et al. | |
| 2011/0261909 A1 | 10/2011 | Andgart et al. | |
| 2011/0306315 A1 | 12/2011 | Subrahmanya et al. | |
| 2012/0069800 A1 | 3/2012 | Soliman et al. | |

OTHER PUBLICATIONS

U.S. Appl. No. 12/394,056 Official Action dated Jun. 10, 2010.
U.S. Appl. No. 12/394,056 Official Action dated Sep. 21, 2010.
U.S. Appl. No. 12/394,056 Official Action dated Dec. 1, 2010.
3GPP TS 25.214, "3rd Generation Partnership Project; Technical Specification Group Radio Access Network; Physical layer procedures (FDD) (Release 6)", V6.11.0, Dec. 2006.
3GPP TS 25.211, "3rd Generation Partnership Project; Technical Specification Group Radio Access Network; Physical channels and mapping of transport channels onto physical channels (FDD) (Release 6)", V6.10.0, Sep. 2009.
European Patent Application # 121600266.6 Extended Search Report dated Aug. 21, 2012.
3GPP TS 43.022, "3rd Generation Partnership Project; Technical Specification Group GSM/EDGE Radio Access Network; Functions related to Mobile Station (MS) in idle mode and group receive mode (Release 9)", V9.2.0, Sep. 2010.
3GPP TS 36.304, "3rd Generation Partnership Project; Technical Specification Group Radio Access Network; Evolved Universal Terrestrial Radio Access (E-UTRA); User Equipment (UE) procedures in idle mode (Release 9)", V9.5.0, Dec. 2010.
3GPP TS 25.304, "3rd Generation Partnership Project; Technical Specification Group Radio Access Network; User Equipment (UE) procedures in idle mode and procedures for cell reselection in connected mode (Release 9)", V9.3.0, Sep. 2010.
U.S. Appl. No. 13/423,220, filed Mar. 18, 2012.
U.S. Appl. No. 13/423,221, filed Mar. 18, 2012.
Nihon Dempa Kogyo Co. Ltd., "NX3225SA Crystal Unit", Data Sheet, Nov. 14, 2011.
U.S. Appl. No. 13/423,220 Office Action dated Sep. 18, 2013.

* cited by examiner

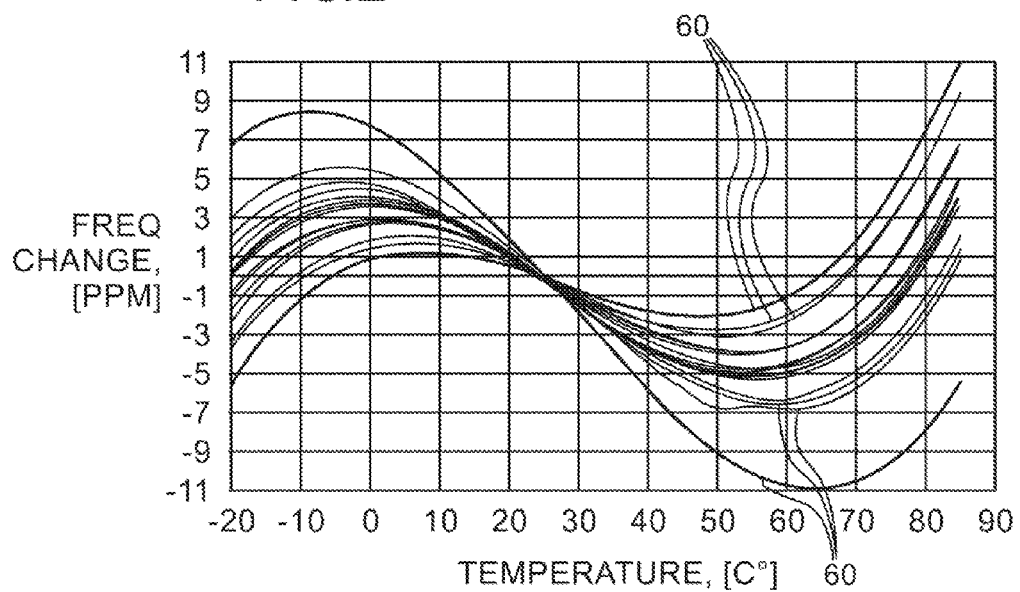

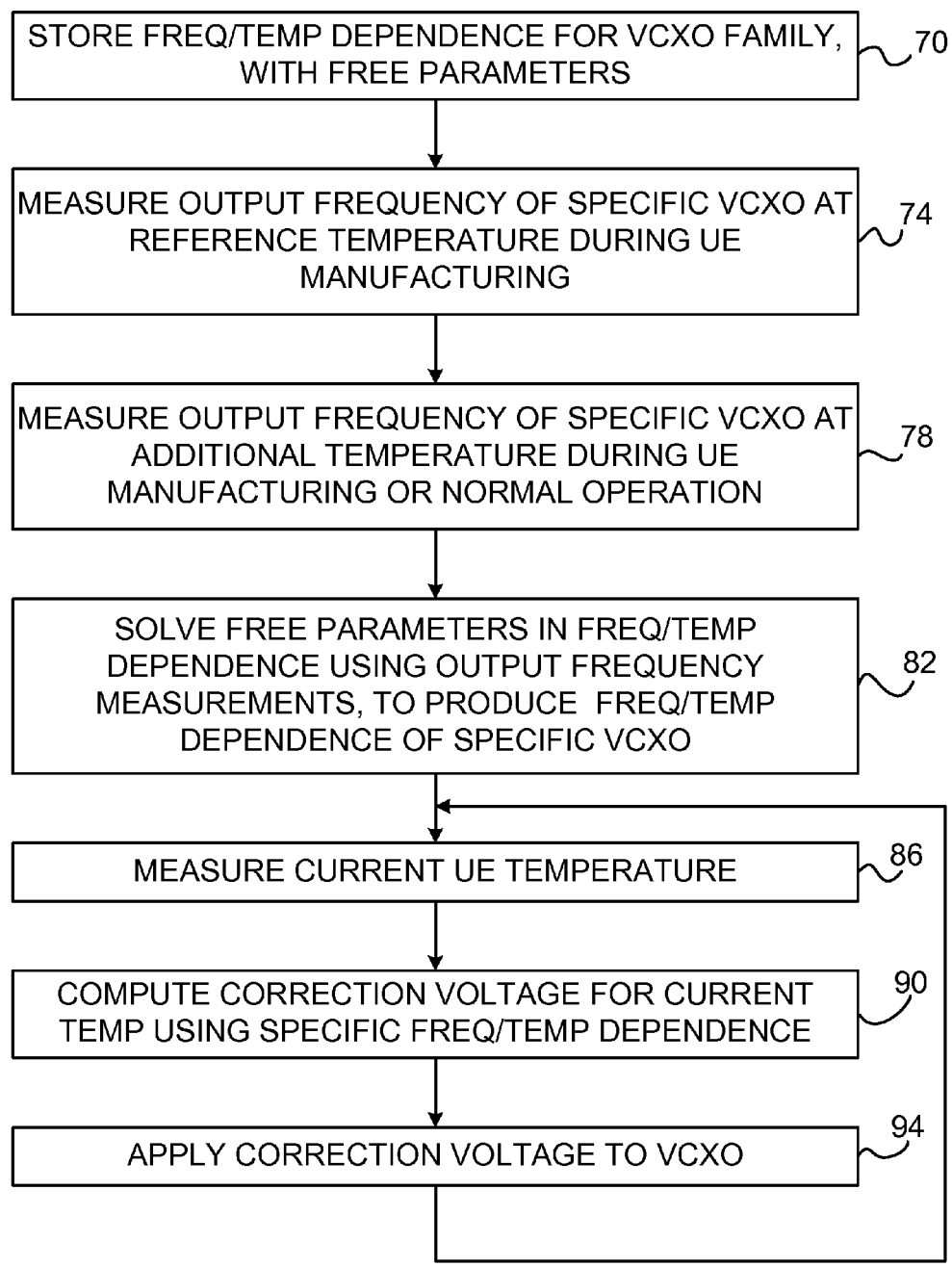

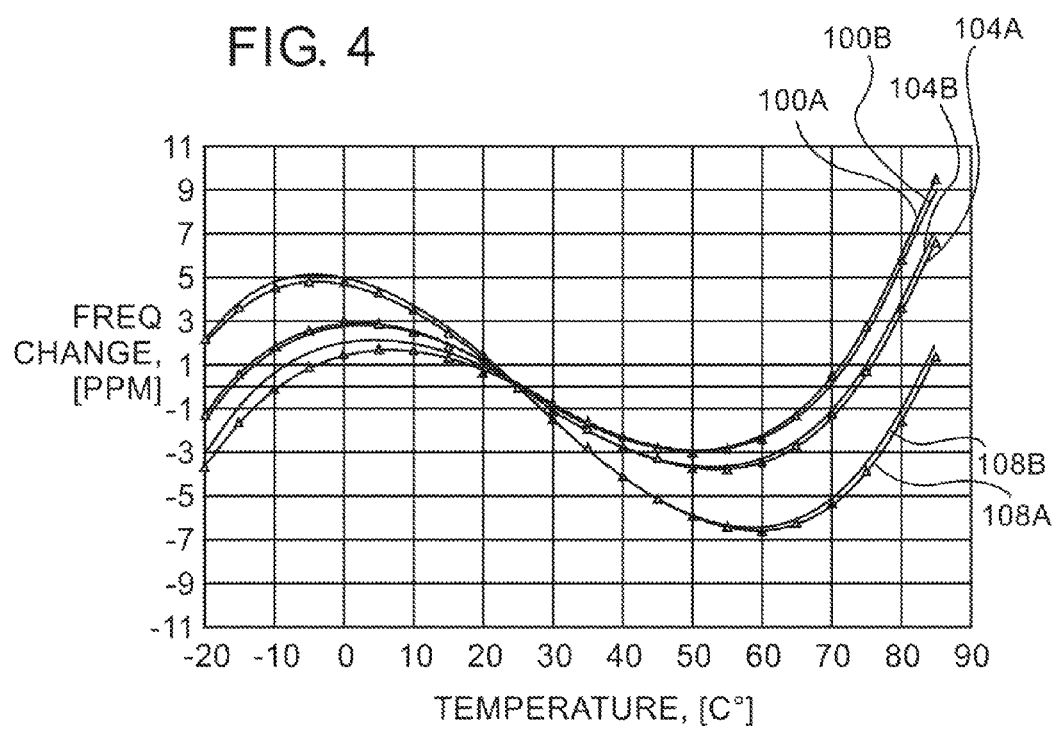

US 8,742,863 B1

TEMPERATURE-CORRECTED FREQUENCY CONTROL WITH CRYSTAL OSCILLATORS FOR INITIAL FREQUENCY ACQUISITION

CROSS-REFERENCE TO RELATED APPLICATIONS

This application is a continuation of U.S. patent application Ser. No. 12/394,056, filed Feb. 27, 2009, which claims the benefit of U.S. Provisional Patent Application 61/032, 268, filed Feb. 28, 2008. The disclosures of all these related applications are incorporated herein by reference.

FIELD OF THE INVENTION

The present invention relates generally to frequency sources, and particularly to methods and systems for controlling crystal oscillators.

BACKGROUND OF THE INVENTION

Crystal oscillators are used in a wide variety of applications. For example, wireless communication terminals often use crystal oscillators as reference sources, such as for generating a reference clock for producing Local Oscillator (LO) signals and/or as a time base for various signal processing operations.

SUMMARY OF THE INVENTION

An embodiment of the present invention provides a wireless communication terminal. The terminal includes a crystal oscillator, which belongs to a specified type of crystal oscillators in which a dependence of an output frequency as a function of temperature has one or more parameters that vary among the crystal oscillators belonging to the specified type. The terminal includes a transceiver, which is arranged to perform signal processing operations to a communication signal using the output frequency of the crystal oscillator. The terminal further includes circuitry, which is arranged to determine a characteristic of the output frequency of the crystal oscillator at one or more operating temperatures, to compute the one or more parameters for the crystal oscillator based on the determined characteristic and the operating temperatures, and to correct a frequency error in the output frequency of the crystal oscillator using the dependence and the computed parameters.

In some embodiments, the characteristic of the output frequency includes at least one characteristic type selected from a group of types consisting of an absolute value of the output frequency, an offset from a nominal value of the output frequency, and a correction to be applied to the output frequency in order to reach the nominal value. In an embodiment, the transceiver is arranged to apply frequency conversion to the communication signal using the output frequency of the crystal oscillator.

In a disclosed embodiment, the circuitry is arranged to determine the characteristic of the output frequency at one or more of the operating temperatures during a calibration process of the terminal. Additionally or alternatively, the circuitry may be arranged to determine the characteristic of the output frequency at one or more of the operating temperatures while the terminal is operated by a user. The circuitry may be arranged to determine the characteristic of the output frequency at one or more of the operating temperatures in response to detecting that the crystal oscillator reached the one or more of the operating temperatures. In another embodiment, the circuitry is arranged to determine the characteristic of the output frequency at two or more operating temperatures during factory calibration of the terminal. In yet another embodiment, the circuitry is arranged to determine the characteristic of the output frequency in at least one operating temperature during factory calibration of the terminal and in at least one other operating temperature during operation of the terminal by a user.

In still another embodiment, the circuitry is arranged to determine the characteristic of the output frequency no later than a first time, to re-determine the characteristic of the output frequency at a second time subsequent to the first time, to re-compute the parameters based on the re-determined characteristic, and to re-correct the frequency error using the re-computed parameters. In some embodiments, the transceiver includes Radio Frequency (RF) circuitry, which is arranged to produce a Local Oscillator (LO) signal that is locked to the output frequency of the crystal oscillator and to down-convert a received Radio Frequency (RF) signal using the LO signal to produce a baseband signal, and the circuitry is arranged to estimate the output frequency responsively to the baseband signal.

In a disclosed embodiment, the transceiver includes a baseband unit, which is arranged to operate an Automatic Frequency Control (AFC) loop having a maximum input frequency offset, and the circuitry is arranged to correct the output frequency of the crystal oscillator so as to reduce the frequency error below the maximum input frequency offset of the AFC loop. In another embodiment, the dependence includes a polynomial, and the circuitry is arranged to compute coefficients of the polynomial. In yet another embodiment, the crystal oscillator includes a Voltage-Controlled Crystal Oscillator (VCXO), and the circuitry is arranged to correct the output frequency of the VCXO by generating a correction voltage based on the dependence and the computed parameters and applying the correction voltage to the VCXO.

In some embodiments, the terminal further includes a temperature sensor operative to measure the operating temperatures, and the circuitry is arranged to receive the measured operating temperatures from the temperature sensor. The circuitry is typically arranged to compute the one or more parameters based on the operating temperatures measured by the temperature sensor. In an embodiment, the circuitry is arranged to correct the frequency error occurring at a given operating temperature by receiving the given operating temperature from the temperature sensor, evaluating the dependence, having the computed parameters, at the given operating temperature, and correcting the output frequency of the crystal oscillator responsively to the evaluated dependence.

There is additionally provided, in accordance with an embodiment of the present invention, apparatus for frequency control. The apparatus includes a crystal oscillator, which belongs to a specified type of crystal oscillators in which a dependence of an output frequency as a function of temperature has one or more parameters that vary among the crystal oscillators belonging to the specified type. The apparatus further includes circuitry, which is arranged to determine a characteristic of the output frequency of the crystal oscillator at one or more operating temperatures, to compute the one or more parameters for the crystal oscillator based on the determined characteristic and the operating temperatures, and to correct a frequency error in the output frequency of the crystal oscillator using the dependence and the computed parameters.

There is also provided, in accordance with an embodiment of the present invention, apparatus for frequency control. The apparatus includes a memory, which is arranged to hold a definition of a dependence of an output frequency of a specified type of crystal oscillators as a function of temperature, the dependence having one or more parameters that vary among the crystal oscillators belonging to the specified type. The apparatus further includes circuitry, which is arranged to determine a characteristic of the output frequency of a given crystal oscillator belonging to the specified type at one or more operating temperatures, to compute the one or more parameters for the given crystal oscillator based on the measured characteristic and the operating temperatures, and to correct a frequency error in the output frequency of the given crystal oscillator using the dependence and the computed parameters.

There is further provided, in accordance with an embodiment of the present invention, a method for frequency control in a wireless communication device. The method includes:

determining a characteristic of an output frequency of a given crystal oscillator at one or more operating temperatures, wherein the given crystal oscillator belongs to a specified type of crystal oscillators in which a dependence of the output frequency as a function of temperature has one or more parameters that vary among the crystal oscillators belonging to the specified type;

computing the one or more parameters for the given crystal oscillator based on the determined characteristic and the operating temperatures; and correcting a frequency error in the output frequency of the given crystal oscillator at a measured operating temperature using the dependence and the computed parameters.

In some embodiments, determining the characteristic of the output frequency includes determining at least one characteristic type selected from a group of types consisting of an absolute value of the output frequency, an offset from a nominal value of the output frequency, and a correction to be applied to the output frequency in order to reach the nominal value.

The present invention will be more fully understood from the following detailed description of the embodiments thereof, taken together with the drawings in which:

BRIEF DESCRIPTION OF THE DRAWINGS

FIG. 2 is a graph showing frequency offset as a function of temperature for crystal oscillators of a given type, in accordance with an embodiment of the present invention;

FIG. 3 is a flow chart that schematically illustrates a method for frequency control in a wireless communication terminal, in accordance with an embodiment of the present invention; and FIG. 4 is a graph showing simulated results of a method for frequency control, in accordance with an embodiment of the present invention.

DETAILED DESCRIPTION OF EMBODIMENTS

Figure 1:
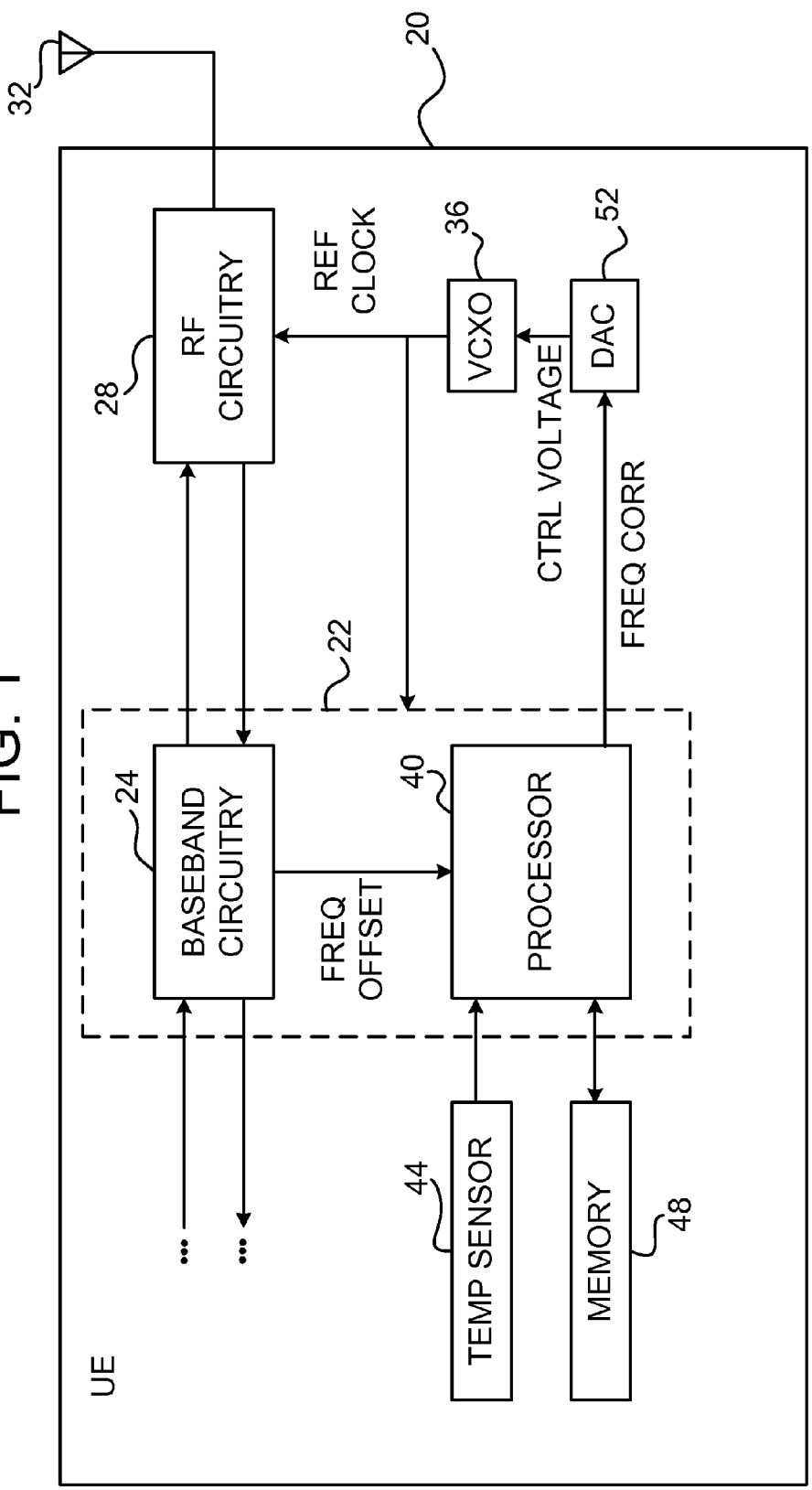
FIG. 1 is a block diagram that schematically illustrates a wireless communication terminal, in accordance with an embodiment of the present invention.

In many applications, a reference clock frequency, for example, as produced by a crystal oscillator, needs to be kept within a narrow specified range for proper demodulation of received signals. Some receivers of wireless communication terminals may employ Automatic Frequency Control (AFC) loops to correct an output frequency of the crystal oscillator. In order for conventional AFC loops to function properly the initial frequency error of crystal oscillator before correction should be kept within some limited frequency range, sometime referred to as a "capture" or "synchronization" range.

As one example, in some Wideband Code Division Multiple Access (WCDMA) receivers, the initial (non-corrected) reference clock frequency error should be within about ±3 ppm. Most crystal oscillators, however, do not meet this accuracy specification, mainly due to frequency variations with temperature. For instance, the output frequency of typical AT-cut quartz crystal oscillators, which are commonly used in mobile and cellular telecommunication applications, may vary by as much as ±15 ppm over the required temperature range.

It is common practice to reach higher frequency accuracy in such applications by using Voltage-Controlled Temperature-Compensated Crystal Oscillators (VCTCXOs) having internal correction of temperature-dependent frequency variations. VCTCXOs, however, are considerably more expensive than uncompensated crystal oscillators. Oscillator cost is a prime consideration, particularly in mass-production applications such as cellular phones.

Embodiments of the present invention that are described herein provide improved methods and systems for frequency control. These methods and systems may correct initial errors in the output frequency of a given crystal oscillator, which are caused by temperature variations, to within ±1 or ±2 ppm. This accuracy, which is well within the required AFC "capture" or "synchronization" range, can be regardless of the basic, uncompensated frequency accuracy of the oscillator. Therefore, when using these techniques, low-cost crystal oscillators can be used in applications that require high frequency accuracy.

The methods and systems described herein use the fact that different crystal oscillators belonging to a given type (e.g., AT-cut or other crystal cut geometry) tend to have similar frequency drifts as a function of temperature. The frequency offset (denoted $\Delta F$) as a function of temperature (denoted T) of a given oscillator type can be modeled by a certain mathematical dependence (e.g., a polynomial function). This dependence has one or more free parameters, whose values change from one specific oscillator to another. For example, the $\Delta F(T)$ dependence of AT-cut quartz crystal oscillators can be approximated as a $3^{rd}$-order polynomial of the form $\Delta F = A \cdot T^3 + B \cdot T^2 + C \cdot T + D$, wherein A and B are constants, and C and D are free parameters that vary from one individual crystal oscillator to another.

In some embodiments, a wireless communication terminal, such as User Equipment (UE) suitable for cellular communications, comprises a crystal oscillator that belongs to a given type. The crystal oscillator is connected to circuitry, which controls its output frequency and corrects frequency offsets caused by temperature changes. A memory of the terminal holds a $\Delta F(T)$ dependence of the oscillator type, for which one or more free parameters are initially unknown. Other circuitry in the terminal measures a characteristic of the output frequency of the crystal oscillator at one or more known operating temperatures. The characteristic may comprise, for example, the absolute output frequency value as a function of temperature, an offset or error in the output frequency from a nominal expected value as a function of temperature, or a correction that is to be applied to the output frequency as a function of temperature in order to reach the expected nominal value.

Based on these measurements, this circuitry solves for the values of the free parameters of the $\Delta F(T)$ dependence, which apply to the specific crystal oscillator unit. In other words, the circuitry determines, using the above-mentioned measurements, an estimated $\Delta F(T)$ dependence of the specific crystal oscillator unit. The measurements may be performed either during the production of a wireless terminal as a part of a calibration process and/or during its normal operation when reaching the appropriate temperature.

Having determined the free parameters, the circuitry is able to correct the output frequency of the crystal oscillator at any known operating temperature, using the estimated $\Delta F(T)$ dependence of the specific crystal oscillator. When the terminal operates at a certain temperature, the circuitry measures this temperature, computes the appropriate correction using the $\Delta F(T)$ dependence of the specific crystal oscillator, and then produces and applies a suitable frequency control signal to the crystal oscillator. For instance, different voltages may be applied to suitably correct the output frequency of a voltage controlled crystal oscillator.

The disclosed methods and systems are particularly effective for correcting frequency offsets that develop in the absence of strong downlink signals that could be used for initial frequency correction and AFC synchronization. Such scenarios occur, for example, when using wideband spectrum noise-like signal types (e.g. WCDMA), which may be received at a negative signal-to-noise ratio before demodulation. Without applying the frequency control methods described herein, initial AFC synchronization of such signals may require multi-step frequency search that may require unacceptably long times.

As will be demonstrated below, the methods and systems described herein are able to correct the output frequency of an uncompensated Voltage Controlled Crystal Oscillator (VCXO) so as achieve frequency accuracy on the order of ±1 ppm over a wide temperature range. Thus, the disclosed techniques enable the use of uncompensated, low-cost crystal oscillators in applications that require high frequency accuracy for initial AFC synchronization.

FIG. 1 is a block diagram that schematically illustrates a wireless communication terminal 20, which is also referred to as User Equipment (UE), in accordance with an embodiment of the present invention. UE 20 may comprise, for example, a cellular phone, a wireless-enabled laptop, Personal Digital Assistant (PDA) or other computer, or any other suitable communication or computing platform having wireless communication capabilities. UE 20 may communicate with any suitable wireless communication network, and may conform to any suitable wireless communication standard or protocol. The embodiments described herein refer mainly to UEs that operate in accordance with various Wideband Code Division Multiple Access (WCDMA) standards, such as the Universal Mobile Telecommunications System (UMTS), CDMA-ONE or CDMA2000 standards, but the disclosed methods and systems can also be used with various other communication standards or protocols, such as Long Term Evolution (LTE). Moreover, the methods and systems described herein can be used in various other sorts of equipment, and are not limited to cellular communication applications.

UE 20 comprises a baseband processing unit 22 and Radio Frequency (RF) circuitry 28, which produce and transmit uplink signals from the UE to the wireless network, and receive and process downlink signals from the wireless network. The RF circuitry and the baseband unit are referred to herein collectively as a transceiver, which applies various signal processing operations (e.g., frequency conversion) to the uplink and downlink signals. In an example embodiment, baseband unit comprises baseband circuitry 24 and a processor 40, which carry out the different baseband processing functions of unit 22. This internal structure is, however, shown by way of example. Unit 22 may have any suitable internal structure and may comprise any other elements.

Transmission and reception are carried out via an antenna 32. On reception, antenna 32 receives a data-carrying, modulated RF signal from the wireless network, e.g., from a base station with which the terminal communicates. RF circuitry 28 down-converts the RF signal to baseband. Baseband unit 22 demodulates the signal so as to extract the data. On transmission, baseband unit 22 produces a modulated baseband signal, which carries data that is to be transmitted to the base station. RF circuitry 28 up-converts the baseband signal to RF and transmits it via antenna 32. Transmission and reception in UE 20 may be multiplexed using any suitable scheme, such as using Time Division Duplex (TDD) or Frequency Division Duplex (FDD).

RF circuitry 28 typically performs the above-mentioned frequency up-conversion and down-conversion operations by mixing the received or transmitted signal with one or more Local Oscillator (LO) signals. The LO signals are locked to a reference clock signal, which is provided by a Voltage-Controlled Crystal Oscillator (VCXO) 36. In addition to performing frequency conversion by the RF circuitry, the reference clock signal can also be used by baseband unit 22 for performing other signal processing operations.

The frequency accuracy of the reference clock signal is critical for the performance of UE 20 in both transmission and reception. The reference clock signal accuracy determines the frequency accuracy of the down- and up-converted signals, and is often necessary for performing the different signal processing functions of the UE properly and/or for meeting standard or regulatory requirements.

In order to control the frequency accuracy of the reference clock, the UE applies an AFC loop based on frequency errors measured by baseband unit 22. Unit 22 typically measures the error in carrier frequency of the received downlink signal, and produces a corresponding control signal. The control signal is applied to the VCXO in order to correct its frequency. In order for the AFC loop to function properly, the initial frequency error of the reference clock (before it is corrected) should be within the synchronization (or capture) range of the loop. After initial AFC synchronization is successful, the AFC loop can continue tracking frequency variations continuously.

On the other hand, the output frequency of VCXO 36 has a limited accuracy and may change in response to varying operating conditions beyond the initial synchronization (capture) range of the AFC loop. In particular, the VCXO output frequency may change considerably as a function of temperature. In a typical implementation, VCXO 36 comprises a crystal oscillator that does not have internal temperature compensation. As such, the basic frequency accuracy of VCXO 36 is on the order of ±10 or ±15 ppm over the operating temperature range (although oscillators having any other suitable accuracy levels can also be used).

During initial synchronization of the AFC loop, baseband unit 22 measures the frequency error in the downlink signal and controls the output frequency of VCXO 36 (i.e., the frequency of the reference clock signal) using methods that are described in detail below. Typically, unit 22 continues to measure the frequency error after initial synchronization, i.e., during normal operation of the AFC loop. Typically, the frequency accuracy of the VCXO after initial correction is improved to below ±1 or ±2 ppm over the entire specified temperature range. This accuracy is sufficient for normal AFC operation, and enables the loop to provide the required frequency accuracy.

UE 20 comprises a temperature sensor 44, which measures the current operating temperature of the UE. Sensor 44 may comprise any suitable type of sensor, such as thermo-resistor. Sensor 44 can be read by baseband unit 22, and unit 22 uses the temperature measurements of sensor 44 when controlling the VCXO output frequency. UE 20 further comprises a memory 48, which is accessed by unit 22. The memory may hold various kinds of information. In particular, the memory holds a frequency-offset/temperature ($\Delta F(T)$) dependence that applies to a type of crystal oscillators to which VCXO 36 belongs. This dependence typically has one or more free parameters that change from one specific oscillator to another. The use of the $\Delta F(T)$ dependence stored in memory for controlling the output frequency of VCXO 36 is explained in detail further below.

Baseband unit 22 controls VCXO 36 by producing a digital frequency correction signal, which is indicative of the frequency correction that should be applied to the VCXO. A Digital-to-Analog Converter (DAC) may be used to convert the digital frequency correction signal into a control voltage. The DAC applies the control voltage to VCXO 36, and the VCXO changes its output frequency responsively to the applied voltage. The DAC may be part of RF circuitry 28 or of unit 22, or it may comprise a separate device.

The UE configuration shown in FIG. 1 is a simplified configuration that is chosen for the sake of clarity. Typically although not necessarily, baseband unit 22 comprises a single baseband Integrated Circuit (IC). Alternatively, however, unit 22 may comprise multiple ICs and/or discrete components. RF circuitry 28 may comprise a single RFIC, multiple RFICs and/or discrete components.

As noted above, it is important to keep the output frequency of VCXO 36 within specified accuracy limits during initial frequency synchronization, in order to allow proper AFC synchronization and subsequent normal operation. After initial synchronization, the AFC loop tracks the frequency of the downlink signals transmitted to the UE from the base station. The base station is assumed to have a highly-accurate frequency source, and the downlink signal is thus used as a reference.

In a typical implementation, unit 22 measures a frequency offset of the downlink signal after it has been down-converted to baseband. Since the RF downlink signal transmitted by the base station is assumed to have an accurate carrier frequency, any frequency offset in the down-converted baseband signal is attributed to offsets in the LO frequency, and is therefore indicative of a frequency error in the output of VCXO 36. As part of the AFC loop, baseband unit 22 produces and sends the corresponding control signal for adjusting the output frequency of VCXO 36, so as to minimize the frequency offset in the down-converted downlink signal.

When the AFC loop operates continually, VCXO 36 is adjusted at a relatively high rate, and the residual frequency offsets in the VCXO output frequency are typically small. In some scenarios, however, the AFC loop is not locked continually, and large frequency offsets may develop, e.g, due to temperature variations. Large frequency offsets may occur, for example, when the UE first establishes communication with a certain base station (e.g., after power-up or hand-off). In this scenario, the UE initially attempts to acquire the base station downlink signal with little or no prior knowledge of its frequency.

In WCDMA systems, for example, this initial acquisition may require a multi-trial acquisition process over the operating frequency range, especially if the desired downlink signals are subject to high environmental or UE noise levels. If the frequency error in the UE reference clock signal exceeds the initial AFC loop synchronization range, the error may significantly increase the number of "trials" in the multi-trial process, and the time needed until successful acquisition. In the case of WCDMA systems, for example, the initial error should be approximately within ±3 ppm. Otherwise, at each step of the above-mentioned acquisition process, the acquisition trials may have to be repeated with different reference clock frequency settings.

As another example, the UE may operate in a Discontinuous Reception (DRX) operational mode, in which it receives the base station downlink signal only at intermittent time intervals having a low duty cycle. When operating in this mode, the VCXO output frequency may shift between successive reception intervals, such as because of temperature changes. This frequency shift may require additional frequency measurement and AFC correction at the beginning of the next reception interval for proper signal demodulation, which may be unacceptable due to time restriction of signal processing.

The above examples are in no way limiting, and are described by way of example. These examples demonstrate that in some scenarios it is desirable to maintain the output frequency of VCXO 36 before AFC synchronization at high initial accuracy, such as in the range of ±2-3 ppm, over the operating temperature range.

It is possible in principle to reach this accuracy level by using internally-compensated crystal oscillators, such as Voltage-Controlled Temperature-Compensated Crystal Oscillators (VCTCXOs). The cost of VCTCXOs, however, is considerably higher than the cost of uncompensated VCXOs. Oscillator cost is a prime consideration, particularly in mass product applications such as cellular phones.

Embodiments of the present invention provide improved methods and systems for frequency control. The methods and systems described herein correct errors in the output frequency of a given crystal oscillator, which are caused by temperature variations. When using the disclosed methods, the output frequency of the crystal oscillator is continually maintained at high accuracy (e.g., ±2 ppm) over the operating temperature range of the oscillator. This sort of accuracy is sufficient for initial AFC synchronization, as well as for subsequent normal operation of the loop, regardless of the initial, uncompensated frequency accuracy of the oscillator. Therefore, when using these techniques, low-cost VCXOs can be used in applications that require high frequency accuracy.

Although the embodiments described herein refer to oscillators installed in wireless communication terminals, the methods and systems described herein can be used to control the frequency of oscillators that are installed in any other suitable type of host system.

FIG. 2 is a graph showing frequency offset as a function of operating temperature for crystal oscillators of a given type, in accordance with an embodiment of the present invention. The example of FIG. 2 shows the frequency characteristics in a family of AT-cut crystal oscillators, over a temperature range of −20° C. to +85° C.

The figure shows multiple plots 60. The difference between the plots is due to variation of the crystal cut around the nominal AT-cut geometry (orientation), within the typical production tolerances. Each plot 60 shows the frequency offset (denoted $\Delta F$) in a specific crystal oscillator unit as a function of operating temperature. This dependence is referred to as a frequency-offset/temperature dependence and is denoted $\Delta F(T)$. (The vertical positions of the different plots may differ significantly according to the initial manufacturing accuracy and other factors, so in FIG. 2, the offsets are normalized with respect to the output frequency at 25° C., and therefore all plots 60 intersect at T=25° C./$\Delta F$=0.)

As can be seen in the figure, the output frequency of different crystal oscillators has a similar characteristic behavior over temperature, but the plots differ from one another in slope and magnitude. This situation is typical of crystal oscillators that belong to a common type, such as AT-cut, BT-cut, X-cut, Y-cut or Z-cut crystals. Typically, crystal oscillators having similar cut geometries have similar $\Delta F(T)$ dependencies, even if they originate from different production batches or even different manufacturers. As will be shown below, the methods and systems described herein are able to correct the initial frequency offset of a crystal oscillator of a given type, irrespective of a family (e.g., batch or manufacturer) to which the oscillator belongs.

The $\Delta F(T)$ dependence in a certain type of crystal oscillators can thus be modeled as a function, which has one or two free parameters that vary between specific crystal oscillators belonging to the type. For example, plots 60 in FIG. 2 can be approximated by a $3^{rd}$-order function of the form $\Delta F = A \cdot T^3 + B \cdot T^2 + C \cdot T + D$, wherein A and B are constants. C and D are free parameters that vary from one plot 60 to another (i.e., from one individual crystal oscillator to another).

In some embodiments, baseband unit 22 stores a $\Delta F(T)$ dependence of this sort in memory 48, determines the free parameter values for the specific VCXO installed in the UE, and then produces a control voltage for controlling VCXO 36 based on the $\Delta F(T)$ dependence, the determined values of the free parameters and the current measured operating temperature.

FIG. 3 is a flow chart that schematically illustrates a method for frequency control in UE 20, in accordance with an embodiment of the present invention. The method begins with memory 48 holding a $\Delta F(T)$ dependence that applies to a type of crystal oscillator to which VCXO 36 belongs, at a storage operation 70. The description that follows refers to the $\Delta F(T)$ dependence shown in FIG. 2 above, but the method of FIG. 3 can be applied to any other suitable $\Delta F(T)$ dependence. The $\Delta F(T)$ dependence may be pre-programmed into memory 48 during production, or stored in the memory at any other suitable time. The dependence may be expressed as the absolute value of the oscillator's output frequency as a function of temperature, as an offset of the output frequency from a certain nominal value as a function of temperature, or as a correction that is to be applied to the output frequency as a function of temperature in order to reach the nominal value.

The $\Delta F(T)$ dependence has one or more free parameters whose values change from one individual VCXO to another. The $\Delta F(T)$ dependence can be represented in memory 48 using any suitable representation, such as a table of values or a functional representation (e.g., polynomial coefficient values). In the present example, $\Delta F(T)$ is approximated by the function $\Delta F = A \cdot T^3 + B \cdot T^2 + C \cdot T + D$. Memory 48 stores the dependence by storing the values of constants A and B, which are common to all crystal oscillators belonging to the type in question. The dependence has two free parameters, namely C and D.

Baseband unit 22 in UE 20 carries out a process of determining the values of the free parameters, which apply to the individual VCXO installed in UE 20. Unit 22 determines the free parameter values by performing two or more measurements of the frequency offset at certain operating temperatures. In other words, the processor determines the specific curve 60 in FIG. 2 that best matches the specific VCXO installed in UE 20, by measuring two or more data points that lie on this curve and deriving the corresponding polynomial coefficients.

In WCDMA systems, for example, two data points (two $\Delta F$ measurements at two respective temperatures) are sufficient to approximate the specific $\Delta F(T)$ dependence with high accuracy, i.e., to provide a frequency error that does not exceed 2-3 ppm relative to the actual $\Delta F(T)$ dependence over the entire operating temperature range.

Baseband unit 22 may perform the reference clock frequency measurements at any desired time, such as during production of UE 20. In particular, the processor may perform one reference clock frequency measurement during a calibration process of the UE at normal conditions, in which the UE is operated at a known temperature. The processor may perform one or more additional reference clock frequency measurements at any other temperature conditions during the UE calibration process (e.g., in a temperature chamber or other calibration setup). Additionally or alternatively, the processor may perform one or more of the reference clock frequency measurements when the appropriate operating temperature is achieved during normal operation of the UE, e.g., when the UE is used in a normal fashion by a subscriber. In either case, the measurements are typically performed when VCXO 36 is already installed in the UE (or other host system).

In the present example, unit 22 performs two output frequency measurements. The first measurement is performed at a certain "normal" temperature during production of the UE, at a first measurement operation 74. The second measurement may be performed either during production or during normal operation of the UE, at a second measurement operation 78.

In performing each of the measurements, baseband unit 22 measures the frequency offset of the UE reference clock relative to the downlink signal used for UE calibration. Alternatively, the frequency offset of the reference clock may be measured directly or via uplink UE signal by external measurement equipment used for UE calibration. Baseband unit 22 also reads the current operating temperature of the UE from temperature sensor 44. Unit 22 stores this pair of values (the current operating temperature and the frequency offset applicable at this temperature) in memory 48. This process is typically repeated for each reference clock frequency measurement.

Baseband unit computes the values of the free parameters of the $\Delta F(T)$ dependence based on the results of the reference clock frequency measurements, at a parameter solving operation 82. In the present example, the processor computes the values of parameters C and D in the function $\Delta F = A \cdot T^3 + B \cdot T^2 + C \cdot T + D$ using the known values of $\Delta F$ at two temperatures. Unit 22 typically stores the computed values of C and D in memory 48.

After performing this computation, the processor has fully characterized the $\Delta F(T)$ dependence of the specific VCXO installed in UE 20, since all four coefficients A, B, C and D are now known. In other words, the processor has determined a specific plot 60 that represents the $\Delta F/T$ dependence of this specific VCXO. Using this information, the processor can correct the frequency offset of this VCXO at any desired operating temperature with high accuracy.

When UE operation begins, baseband processor 24 measures the current operating temperature of the UE by reading sensor 44, at a temperature measurement operation 86. Unit 22 computes a frequency correction value according to the known $\Delta F(T)$ dependence that applies to the specific VCXO and to the current operating temperature, at a correction calculation operation 90. Unit 22 computes and generates a frequency control signal corresponding to this frequency correction according to an appropriate VCXO control characteristic. Unit 22 outputs the frequency control signal via DAC 52, which converts it to a correction voltage. DAC 52 applies the correction voltage to VCXO 36, at a correction operation 94. This frequency correction allows initial AFC synchronization, and subsequent normal operation of the loop. After initial synchronization, the AFC loop continues frequency tracking based on measuring the frequency offset of the downconverted downlink signal received by the UE.

The method of FIG. 3 is repeated whenever the UE begins to operate. In such cases, the frequency offset can be corrected to below ±1 or ±2 ppm over a wide temperature range, even though the uncompensated VCXO frequency may vary over ±15 ppm over temperature. In particular, when the UE employs an AFC loop that is able to capture the downlink signal from only a certain maximum initial frequency offset (e.g., ±3 ppm), the method of FIG. 3 enables unit 22 to reduce the frequency offset of an uncompensated VCXO into the specified capture range of the AFC loop. The method can be also used for reducing frequency offset of VCXO during Discontinuous Reception (DRX) pauses, during which the downlink signal is not available and normal frequency tracking by AFC is not possible.

In the embodiments described herein, the $\Delta F(T)$ dependence of the oscillator type has two free parameters, and unit 22 solves these parameters for the specific VCXO by performing two frequency offset measurements at known temperatures. Generally, however, the $\Delta F(T)$ dependence of the oscillator type may have any desired number of free parameters, and unit 22 may determine the values of these parameters by performing any desired number of frequency/temperature measurements.

Typically, the number of the initial frequency/temperature measurements performed by baseband processor 24 should be equal to or greater than the number of the free parameters in the $\Delta F(T)$ dependence of the oscillator type. In the present example, the $\Delta F(T)$ dependence has two free parameters, and the processor performs two output frequency measurements. In some embodiments, the processor may perform a higher number of measurements in order to achieve higher accuracy.

As noted above, one or more of the frequency/temperature measurements may be performed during normal operation of the UE (see operation 78 above) at predefined temperature values. When baseband unit 22 detects that the UE operating temperature reaches one of the predefined temperatures, it measures the frequency offset and stores the result, as described above. As another example, the UE may comprise a heating element (e.g., a resistor), which heats the VCXO to a desired temperature in order to measure the frequency offset at that temperature. The UE may use its own transmitter Power Amplifier (PA) as a heating element.

In the description above, unit 22 measures an offset in the output frequency of the VCXO. In general, however, unit 22 may measure various characteristics of the output frequency that are indicative of this offset. Such characteristics may comprise, for example, the absolute value of the VCXO output frequency or a correction that is to be applied to the VCXO frequency in order to reach the nominal value (i.e., in order to remove the offset).

When performing these measurements, the values of the free parameters (C and D) for the specific VCXO are not yet known, and therefore the frequency offset of the VCXO may be relatively high. In this scenario, the UE may use the nominal $\Delta F(T)$ dependence of the oscillator type for faster capturing the base station signal. If necessary, the UE may apply a multi-stage AFC process in order to capture the base station signal, given the relatively high frequency offset.

Additionally or alternatively, unit 22 may use any other available information in order to accelerate the initial AFC acquisition, until the $\Delta F(T)$ dependence of the specific VCXO is known. For example, when the UE comprises a dual-mode UE that communicates with an additional network (e.g., a GSM network), unit 22 may obtain frequency control information from the other network.

In some embodiments, baseband unit 22 may repeat the initial computation of the $\Delta F(T)$ dependence (operations 70-82) from time to time. For example, the $\Delta F(T)$ dependence of the specific VCXO in UE 20 may change slightly over time due to aging effects. Therefore, it may be advantageous to repeat operations 70-82 above occasionally (e.g., once every several months) in order to adapt to aging-related variations in the $\Delta F(T)$ dependence of the VCXO. In the present example, baseband unit 22 may re-compute parameters C and D from time to time, and update the parameter values stored in memory 48.

FIG. 4 is a graph showing simulated results of a method for frequency control, in accordance with an embodiment of the present invention. FIG. 4 compares, for three different VCXOs, the actual $\Delta F(T)$ dependence of the VCXO to the modeled $\Delta F(T)$ dependence of the VCXO ($\Delta F = A \cdot T^3 + B \cdot T^2 + C \cdot T + D$, after computing the free parameters C and D based on two frequency measurements at known temperatures).

A plot 100A shows the actual $\Delta F(T)$ dependence of a given VCXO, and a plot 100B shows the modeled $\Delta F(T)$ dependence of this VCXO. Similarly, plots 104A and 104B respectively show the actual and modeled $\Delta F(T)$ dependencies of another VCXO. Plots 108A and 108B respectively show the actual and modeled $\Delta F(T)$ dependencies of yet another VCXO. In all three cases, the deviation between the actual and modeled $\Delta F(T)$ dependence is smaller than ±1 ppm.

Although the embodiments described herein mainly address frequency control of uncompensated VCXOs in wireless communication terminals, the principles of the present invention can also be used for other applications, such as in data modules for ultra-mobile personal computers and mobile Internet devices, as well as various other applications.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A wireless communication terminal, comprising:
a crystal oscillator, which belongs to a specified type of crystal oscillators in which a dependence of an output frequency as a function of temperature has one or more temperature dependence coefficients that vary among the crystal oscillators belonging to the specified type;
a transceiver, which is arranged to operate an Automatic Frequency Control (AFC) loop having a frequency accuracy requirement for initial AFC synchronization that is more stringent than an uncompensated frequency accuracy of the given crystal oscillator; and
circuitry, which is arranged to determine one or more output frequencies of the crystal oscillator at one or more respective operating temperatures, to compute the one or more temperature dependence coefficients for the crystal oscillator based on both of the one or more determined output frequencies and the one or more operating temperatures, to correct a frequency error in the output frequency of the crystal oscillator using the dependence and the computed temperature dependence coefficients in an initial AFC synchronization stage in which the AFC loop is unlocked, to ascertain, before receiving a signal to be tracked by the AFC loop, that the corrected frequency error meets the frequency accuracy requirement of the AFC loop, and, in a subsequent tracking stage, to lock the AFC loop on the received signal and to correct a frequency of the received signal using the locked AFC loop.

2. The terminal according to claim 1, wherein the circuitry is arranged to determine two or more output frequencies of the crystal oscillator at two or more respective operating temperatures, and to compute the one or more temperature dependence coefficients for the crystal oscillator based on both of the two or more determined output frequencies and the two or more operating temperatures.

3. The terminal according to claim 1, wherein the circuitry is arranged to determine the output frequencies at one or more of the operating temperatures during a calibration process of the terminal.

4. The terminal according to claim 1, wherein the circuitry is arranged to determine the output frequencies at one or more of the operating temperatures while the terminal is operated by a user.

5. The terminal according to claim 1, wherein the circuitry is arranged to determine the output frequencies at one or more of the operating temperatures in response to detecting that the crystal oscillator reached the one or more of the operating temperatures.

6. The terminal according to claim 1, wherein the transceiver comprises Radio Frequency (RF) circuitry, which is arranged to produce a Local Oscillator (LO) signal that is locked to the output frequency of the crystal oscillator and to down-convert a received Radio Frequency (RF) signal using the LO signal to produce a baseband signal, and wherein the circuitry is arranged to estimate the output frequency responsively to the baseband signal.

7. The terminal according to claim 1, wherein the dependence comprises a polynomial, and wherein the circuitry is arranged to compute the temperature dependence coefficients by computing coefficients of the polynomial.

8. The terminal according to claim 1, wherein the crystal oscillator comprises a Voltage-Controlled Crystal Oscillator (VCXO), and wherein the circuitry is arranged to correct the output frequency of the VCXO by generating a correction voltage based on the dependence and the computed temperature dependence coefficients and applying the correction voltage to the VCXO.

9. A mobile communication terminal comprising the apparatus of claim 1.

10. A chipset for processing signals in a mobile communication terminal, comprising the apparatus of claim 1.

11. A method for frequency control in a wireless communication device, the method comprising:

determining one or more output frequencies of a given crystal oscillator at one or more respective operating temperatures, wherein the given crystal oscillator belongs to a specified type of crystal oscillators in which a dependence of the output frequency as a function of temperature has one or more temperature dependence coefficients that vary among the crystal oscillators belonging to the specified type;

computing the one or more temperature dependence coefficients for the given crystal oscillator based on both of the two or more determined output frequencies and the two or more operating temperatures;

operating an Automatic Frequency Control (AFC) loop having a frequency accuracy requirement for initial AFC synchronization that is more stringent than an uncompensated frequency accuracy of the given crystal oscillator; and correcting a frequency error in the output frequency of the given crystal oscillator at a measured operating temperature using the dependence and the computed temperature dependence coefficients in an initial AFC synchronization stage in which the AFC loop is unlocked, ascertaining, before receiving a signal to be tracked by the AFC loop, that the corrected frequency error meets the frequency accuracy requirement of the AFC loop, and, in a subsequent tracking stage, locking the AFC loop on the received signal and correcting a frequency of the received signal using the locked AFC loop.

12. The method according to claim 11, wherein determining the output frequencies comprises measuring the output frequencies at one or more of the operating temperatures during a calibration process of the terminal.

13. The method according to claim 11, wherein determining the output frequencies comprises measuring the output frequencies at one or more of the operating temperatures while the terminal is operated by a user.

14. The method according to claim 11, wherein determining the output frequencies comprises producing a Local Oscillator (LO) signal that is locked to the output frequency of the crystal oscillator, down-converting a received Radio Frequency (RF) signal using the LO signal to produce a baseband signal, and estimating the output frequency responsively to the baseband signal.

15. The method according to claim 11, wherein the dependence comprises a polynomial, and wherein computing the temperature dependence coefficients comprises computing coefficients of the polynomial.

16. The method according to claim 11, wherein the crystal oscillator comprises a Voltage-Controlled Crystal Oscillator (VCXO), and wherein correcting the frequency error comprises generating a correction voltage based on the dependence and the computed temperature dependence coefficients and applying the correction voltage to the VCXO.

* * * * *